(12) United States Patent
Wu et al.

(10) Patent No.: US 12,015,324 B2
(45) Date of Patent: Jun. 18, 2024

(54) MOTOR CONTROLLER ELECTRONICS ARRANGEMENTS WITH ACTIVELY COOLED FEEDER CABLES

(71) Applicant: Hamilton Sundstrand Corporation, Charlotte, NC (US)

(72) Inventors: Hailing Wu, Glastonbury, CT (US); Gary L. Miles, Stillman Valley, IL (US); Mark Hamilton Severson, Rockford, IL (US); Aritra Sur, South Windsor, CT (US); Xin Wu, Glastonbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 693 days.

(21) Appl. No.: 17/223,513

(22) Filed: Apr. 6, 2021

(65) Prior Publication Data

US 2021/0320554 A1   Oct. 14, 2021

Related U.S. Application Data

(60) Provisional application No. 63/008,105, filed on Apr. 10, 2020.

(51) Int. Cl.
*H02K 11/33* (2016.01)
*H02K 5/20* (2006.01)
(Continued)

(52) U.S. Cl.
CPC ............. *H02K 5/203* (2021.01); *H02K 5/225* (2013.01); *H02K 9/19* (2013.01); *H02K 11/33* (2016.01); *B64D 27/24* (2013.01)

(58) Field of Classification Search
CPC ........ H02K 5/225; H02K 11/30; H02K 11/33; H02K 9/19; H02K 5/203; H02K 9/22;
(Continued)

(56) References Cited

U.S. PATENT DOCUMENTS 7,710,228 B2   5/2010 Feng et al.
9,178,400 B2   11/2015 Pal et al.
(Continued)

FOREIGN PATENT DOCUMENTS

EP   3392148 A1   10/2018
EP   3392149 A1   10/2018
WO   2020015825 A1   1/2020

OTHER PUBLICATIONS

European Search Report Issued in European Application No. 21167380.1-1203 dated Sep. 6, 2021; 6 Pages.

*Primary Examiner* — Alexander A Singh
(74) *Attorney, Agent, or Firm* — CANTOR COLBURN LLP

(57) ABSTRACT

An electronics assembly including a motor controller electronics arrangement includes a housing enclosing a solid-state switch array, a cold plate arranged within the housing and in thermal communication with the solid-state switch array, and a feeder cable. The feeder cable is electrically connected to the solid-state switch array, has a coolant jacket extending thereabout, is separated from the switch arrangement by the housing, and is in liquid communication with the cold plate to limit heat communicated by the feeder cable into the housing. Electrical systems and methods of cooling feeder cables are also described.

20 Claims, 4 Drawing Sheets

(51) Int. Cl.
*H02K 5/22* (2006.01)
*H02K 9/19* (2006.01)
*B64D 27/24* (2006.01)

(58) Field of Classification Search
CPC .. H02K 9/18; H02K 9/00; H02K 9/02; H05K 7/20927; B64D 27/24
USPC .................................. 310/71, 52, 54, 58, 64
See application file for complete search history.

(56) References Cited

U.S. PATENT DOCUMENTS

| | | | |
|---|---|---|---|
| 2014/0268572 A1* | 9/2014 | Ranjan | H01L 23/427 |
| | | | 361/700 |
| 2019/0100319 A1 | 4/2019 | Mackin | |
| 2020/0091832 A1* | 3/2020 | Pal | H05K 7/20 |
| 2021/0066991 A1* | 3/2021 | Morika | H02M 7/003 |

* cited by examiner

MOTOR CONTROLLER ELECTRONICS ARRANGEMENTS WITH ACTIVELY COOLED FEEDER CABLES

CROSS-REFERENCE TO RELATED APPLICATIONS

This application claims the benefit of U.S. Provisional Application No. 63/008,105 filed Apr. 10, 2020, the disclosure of which is incorporated herein by reference in its entirety.

BACKGROUND

The present disclosure is generally related to electrical systems, and more particularly to managing heat in electrical systems.

Vehicles, such as in aircraft, commonly employ electric machines (e.g., generators, such as solid-state generators, and motors) for various vehicle functions, such as for propulsion. The motors generally receive electrical power through a feeder cable. The feeder cable is generally connected to a power supply, such as a battery and/or a generator, through a motor controller. The motor controller controls the electric motor by controlling the electrical power provided to the motor, typically through varying frequency of alternating current (AC) power communicated to motor through the feeder cable. As the feeder cable communicates electrical power the current conveying the electrical power resistively heats the feeder cable. In addition to a motor controller, there are other high electrical current applications requiring feeder wire cooling.

Heat generated by resistive heating of the feeder cable increases temperature of the electrical conductor carrying the electric current, as well as the insulation wrapping the conductor. The heat is generally communicated to the ambient air environment through the sheath electrically insulating the electrical conductor. The electrical conductor also conducts heat to the auxiliary circuitries connected to opposite ends of the electrical conductor, including the motor controller. Since the amount of heat conducted to the motor controller corresponds to temperature of the feeder cable, and feeder cable temperature corresponds to both the amount of current carried by the feeder cable and gauge of the electrical conductor, the electrical conductor is generally sized to accommodate the continuous and peak current carried by the feeder cable.

Such systems and methods have generally been acceptable for their intended purpose. However, there remains a need in the art, especially for high power applications, for improved motor controller electronics arrangements, electrical systems, aircraft propulsion architecture, and methods for cooling feeder cables in motor controller electronics arrangements.

BRIEF DESCRIPTION

Disclosed is an electronics assembly including a motor controller electronics arrangement, comprising: a housing enclosing a solid-state switch array; a cold plate arranged within the housing and in thermal communication with the solid-state switch array; a feeder cable electrically connected to the solid-state switch array; and a coolant jacket extending about the feeder cable and separated from the switch arrangement by the housing, wherein the feeder cable is in liquid communication with the cold plate to limit communication of heat from the feeder cable to an interior of the housing.

In addition to one or more of the above disclosed aspects of the electronics assembly, or as an alternate, the electronics assembly includes a coolant supply conduit fluidly coupling the coolant jacket to the cold plate.

In addition to one or more of the above disclosed aspects of the electronics assembly, or as an alternate, the electronics assembly includes a coolant return conduit fluidly coupling the coolant jacket to the cold plate.

In addition to one or more of the above disclosed aspects of the electronics assembly, or as an alternate, the electronics assembly includes a liquid coolant circulating between the coolant jacket and the cold plate.

In addition to one or more of the above disclosed aspects of the electronics assembly, or as an alternate, the feeder cable comprises: an electric motor portion; a motor controller portion connected to the electric motor portion; and an intermediate portion connected the motor controller portion to the electric motor portion, wherein the electric motor portion of the feeder cable is spaced apart from the motor controller portion of the feeder cable by the intermediate portion of the feeder cable.

In addition to one or more of the above disclosed aspects of the electronics assembly, or as an alternate, the coolant jacket is spaced apart from the housing.

In addition to one or more of the above disclosed aspects of the electronics assembly, or as an alternate, the coolant jacket has a coolant inlet and a coolant outlet, and wherein the coolant inlet separates the coolant outlet from the housing along the feeder cable.

In addition to one or more of the above disclosed aspects of the electronics assembly, or as an alternate, the electronics assembly includes a coolant supply conduit fluidly coupling the coolant inlet to the cold plate.

In addition to one or more of the above disclosed aspects of the electronics assembly, or as an alternate, the electronics assembly includes a coolant return conduit fluidly coupling the coolant outlet to the cold plate.

In addition to one or more of the above disclosed aspects of the electronics assembly, or as an alternate, the electronics assembly includes a liquid coolant traversing the coolant jacket and in thermal communication with the feeder cable through the coolant jacket.

In addition to one or more of the above disclosed aspects of the electronics assembly, or as an alternate, the electronics assembly includes a source terminal electrically connected to the feeder cable by the switch arrangement.

In addition to one or more of the above disclosed aspects of the electronics assembly, or as an alternate, the electronics assembly includes a pump fluidly coupling the cold plate to the coolant jacket; and a heat exchanger fluidly coupling the coolant jacket to the cold plate.

In addition to one or more of the above disclosed aspects of the electronics assembly, or as an alternate, the electronics assembly includes an electric motor electrically connected to the switch arrangement by the feeder cable.

In addition to one or more of the above disclosed aspects of the electronics assembly, or as an alternate, wherein the feeder cable is an A-phase feeder cable, wherein the coolant jacket is an A-phase coolant jacket, and further comprising: a B-phase feeder cable electrically connected to the solid-state switch array; and a B-phase coolant jacket extending about the B-phase feeder cable, wherein the B-phase coolant jacket is separated from the solid-state switch array by the housing and is in liquid communication with the cold plate.

Disclosed is an electrical system, including an electric motor; an electronics assembly as disclosed above, wherein the feeder cable is electrically connected to the electric motor; and a power source electrically connected to the feeder cable by the solid-state switch array.

In addition to one or more of the above disclosed aspects of the electrical system, or as an alternate, the electronics assembly further includes coolant supply conduit fluidly coupling the coolant jacket to the cold plate; a coolant return conduit fluidly coupling the coolant jacket to the cold plate; and a liquid coolant circulating between the coolant jacket and the cold plate.

In addition to one or more of the above disclosed aspects of the electrical system, or as an alternate, the coolant jacket has a coolant inlet and a coolant outlet, and wherein the coolant inlet separates the coolant outlet from the housing along the feeder cable, the electronics assembly further includes: a pump fluidly coupling the cold plate to the coolant jacket; and a heat exchanger fluidly coupling the coolant jacket to the cold plate.

Disclosed is a method of cooling a feeder cable, including at a housing enclosing a solid-state switch array, a cold plate arranged within the housing and in thermal communication with the solid-state switch array, and a feeder cable electrically connected to the solid-state switch array and having a coolant jacket extending thereabout that is separated from the solid-state switch array by the housing and in liquid communication with the cold plate, generating heat with supply power flowing through the feeder cable; flowing liquid coolant to the coolant jacket from the cold plate; communicating heat from the feeder cable to the liquid coolant as the liquid coolant traverses the coolant jacket; and returning the liquid coolant to the cold plate.

In addition to one or more of the above disclosed aspects of the method, or as an alternate, the method includes actively circulating the liquid coolant through the coolant jacket and along the feeder cable using a pump fluidly coupling the coolant jacket to the cold plate.

In addition to one or more of the above disclosed aspects of the method, or as an alternate, the feeder cable has a proximal portion and a distal portion, the proximal portion connecting the distal portion to the housing, the method further comprising flowing the liquid coolant outward from the housing to maintain the proximal portion at lower temperature than the distal portion of the feeder cable.

Technical effects of the present disclosure include the capability to limit (or eliminate entirely) communication of heat generated by feeder cable resistive heating into motor controllers. In certain examples the present disclosure provides a motor controller electronics arrangement having feeder cables that are undersized relative to peak currents carried by the feeder cables due to cooling of an intermediate portion of the feeder cable proximate to the motor controller. In accordance with certain examples, the present disclosure allows feeder cables to run at temperatures greater than the temperature rating of auxiliary circuitries arranged within the housing and otherwise heated by the feeder cable due to thermal separation provided by the coolant jacket between the motor controller portion and the motor portion of the feeder cable.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
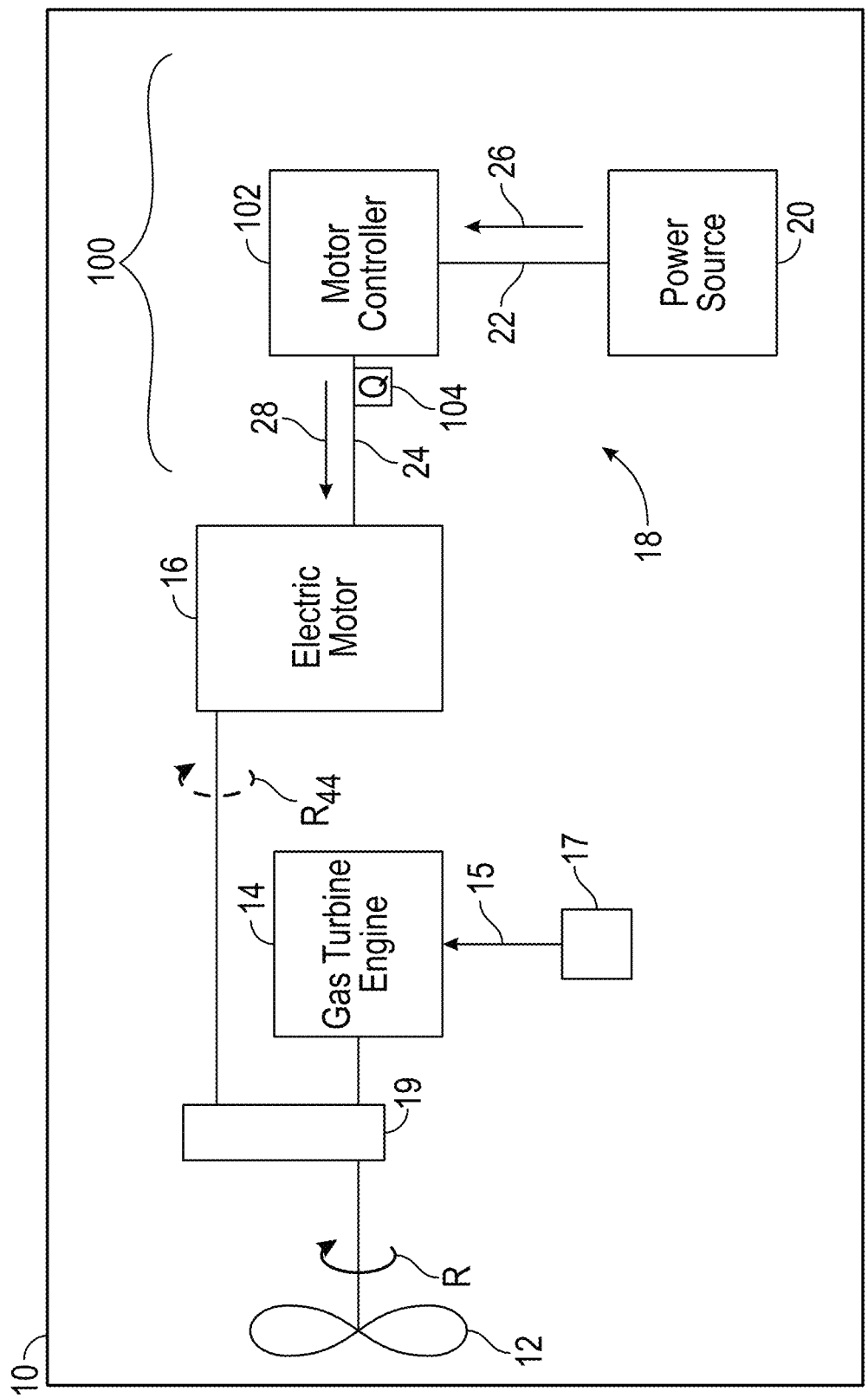
FIG. 1 is a schematic view of a vehicle including an electrical system with a motor controller, showing a power source connected to an electric motor through a source cable and a supply cable (i.e. feeder cable)

Reference will now be made to the drawings wherein like reference numerals identify similar structural features or aspects of the subject disclosure. For purposes of explanation and illustration, and not limitation, a partial view of an example of a motor controller electronics arrangement in accordance with the disclosure is shown in FIG. 1 and is designated generally by reference character 100. While the disclosure is directed to the motor controller electronics arrangement 100, the disclosure is applicable to all high power electronics, including inverters, converters and other power electronics assemblies.

Other embodiments of motor controller electronics arrangements, electrical systems, and methods of cooling motor controllers in motor controller electronics arrangements are provided in FIGS. 2-4, as will be described. The systems and methods described herein can be used to provide power to electric motors, such as in electrically propelled aircraft, though the present disclosure is not limited to electrically propelled aircraft or to any particular type of vehicle in general.

With reference to FIG. 1, a vehicle 10, e.g., a hybrid electric aircraft, is shown. The vehicle 10 includes a propulsor 12, a gas turbine engine 14 that receives fuel 15, e.g., from an aircraft fuel tank 17, and an electric motor 16. The gas turbine engine 14 and electric motor 16 may be connected in parallel to the propulsor 12 by a gearbox 19. The vehicle 10 also includes an electrical system 18 (otherwise referred to as an electronics assembly).

The propulsor 12 is operably associated with the gas turbine engine 14, e.g., via a shaft and/or a gearbox. The electric motor 16 is operably connected to the gas turbine engine 14 and is electrically connected to the electrical system 18. In certain examples the propulsor 12 includes a propeller or a fan. In accordance with certain examples the electric motor 16 is an alternating current (AC) power electric motor, such as a three (3) phase AC electric motor.

The electrical system 18 includes a power source 20, a source bus 22, a motor controller 102, and a feed bus 24. The power source 20 is connected to the source bus 22, the source bus 22 connects the power source 20 to the motor controller 102, and the feed bus 24 connects the motor controller 102 to the electric motor 16. In certain examples the power source 20 include a direct current (DC) power source, such as a DC generator and/or a battery. In accordance with certain examples the power source 20 includes an alternating current (AC) power source, such as an AC generator. It is contemplated that the electric motor 16 be an alternating current (AC) motor, such as a three (3) phase electric motor.

The motor controller 102 is arranged to convert the source power 26 provided by the power source 20 via the source bus 22 into a flow of feed power 28. The feed power 28 is communicated by the motor controller 102 to the electric motor 16 via the feed bus 24 and is adapted for control of the electric motor 16, e.g., via controlling the frequency of the feed power 28. The feed power 28 causes the electric motor 16 to rotate R the propulsor 12. In certain examples the gas turbine engine 14 and the electric motor 16 are arranged to cooperatively rotate the propulsor 12 during certain operating regimes, e.g., during takeoff and climbing of an aircraft, allowing the gas turbine engine 14 to be undersized in relation to the peak horsepower requirement of the vehicle 10.

As will be appreciated by those of skill in the art in view of the present disclosure, flowing the feed power 28 through the feed bus 24 resistively heats the feed bus 24, increasing temperature of the feed bus 24. Since increasing the temperature of the feed bus 24 increases temperature of electrical components of the motor controller 102 via conduction, the feed bus 24 should be sized to limit the amount of heat conducted into the motor controller 102. To limit the size of the feed bus 24 (and thereby thermal conduction) the motor controller electronics arrangement 100 includes a coolant jacket 104. The coolant jacket 104 is thermally coupled to the feed bus 24 and is arranged to limit communication of the heat Q into the motor controller 102 from the feed bus 24.

Figure 2:
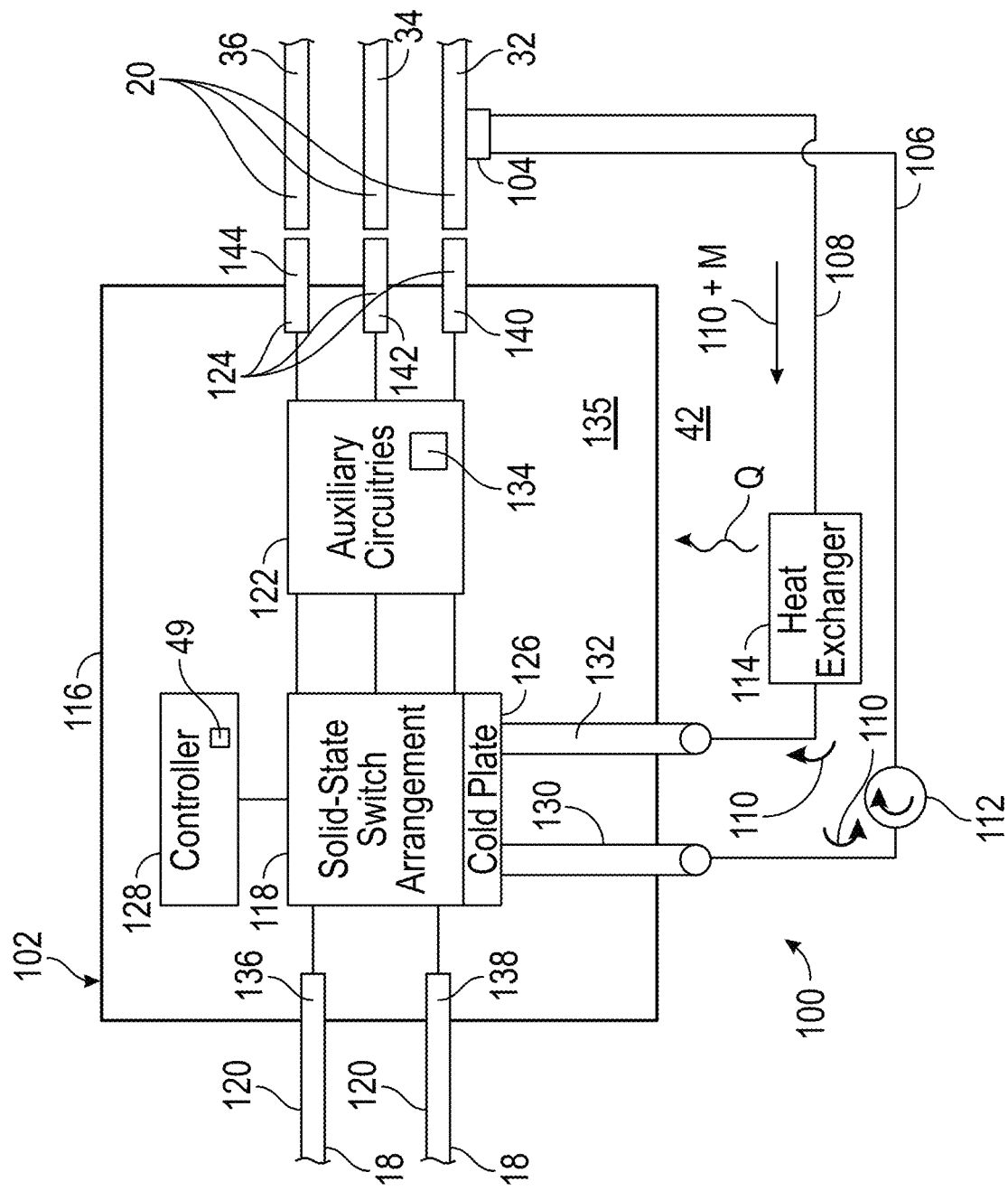
FIG. 2 is a schematic view of the motor controller electronics arrangement of FIG. 1, showing the coolant jacket receiving cold liquid coolant at a coolant inlet and returning heated liquid coolant to the cold plate from a coolant outlet.

With reference to FIG. 2, the motor controller electronics arrangement 100 is shown. The motor controller electronics arrangement 100 includes a motor controller 102, a coolant jacket 104, a coolant supply conduit 106, and a coolant return conduit 108. The motor controller electronics arrangement 100 also includes a liquid coolant 110, a liquid coolant pump 112, and a heat exchanger 114. As an alternative to the pump, other configurations could also work including passive circulation, phase change coolant, etc.

The motor controller 102 includes a housing 116, a solid-state switch array 118, a source terminal 120. The motor controller 102 also includes auxiliary circuitries 122, a supply terminal 124, a cold plate 126, and a controller 128. The motor controller 102 additionally includes a coolant supply port 130 and a coolant return port 132.

The solid-state switch array 118, auxiliary circuitries 122, and the cold plate 126 are enclosed with the interior 135 of the housing 116. The solid-state switch array 118 is configured to convert the source power 26 (shown in FIG. 1) into the supply power 30 (shown in FIG. 1). In this respect the controller 128 is operably connected to the solid-state switch array 118 and has a motor mode 44 wherein the controller 128 causes the solid-state switch array 118 to convert the source power 26 (shown in FIG. 1) into the feed power 28 (shown in FIG. 1).

The solid-state switch array 118 is operably associated with the controller 128 and is electrically connected to the auxiliary circuitries 122. The solid-state switch array 118 also electrically couples the source terminal 120 to the supply terminal 124 and is thermally coupled to the cold plate 126 (e.g., in intimate mechanical contact) for rejecting heat Q thereto while converting the source power 26 into the supply power 30. It is contemplated that the auxiliary circuitries 122 has a temperature rating 134, e.g., a temperature below reliable operation of the auxiliary circuitries 122 is assured. In certain examples the auxiliary circuitries 122 includes one or more of a capacitor and/or an inductor.

The source terminal 120 extends through the housing 116 to the environment external to the housing 116, is electrically connected to the source bus 22, and electrically couples the source bus 22 to the solid-state switch array 118. In the illustrated example the source terminal includes a DC source terminal 136 and a DC return terminal 138. The DC source terminal 136 seats thereon the DC source lead 26A and the DC return terminal 138 seats thereon the DC return lead 26B to communicate the source power 26 to the solid-state switch array 118.

The supply terminal 124 extends through the housing 116 to the environment external to the housing 116, is electrically connected to the feed bus 24, and electrically couples the solid-state switch array 118 to the feed bus 24. In the illustrated example the supply terminal 124 is a three-phase terminal and includes an A-phase terminal 140 (corresponding to a first phase of the three phase (AC)), a B-phase terminal 142 (corresponding to a second phase of the three phase (AC)), and a C-phase terminal 144 (corresponding to a third phase of the three phase (AC)). The A-phase terminal 140 seats thereon the A-phase feeder cable 32, which electrically couples the A-phase terminal 140 to the electric motor 16. The B-phase terminal 142 seats thereon the B-phase feeder cable 34, which electrically couples the B-phase terminal 142 to the electric motor 16. The C-phase terminal 144 seats thereon the C-phase feeder cable 36, which electrically couples the C-phase terminal 144 to the electric motor 16. It is to be appreciated that another form of conductor, such as a bus bar, may be used for the cables 32-36.

The coolant supply port 130 extends through the housing 116 and into the external environment outside of the housing 116, is connected to the cold plate 126, and seats thereon the coolant supply conduit 106. The coolant return port 132 extends through the housing 116 and into the interior of the housing 116, is connected to the cold plate 126, and seats thereon the coolant return conduit 108. The coolant jacket 104 is arranged outside of the housing 116, is spaced apart from the housing 116, and extends about the A-phase feeder cable 32. More specifically, the coolant jacket 104 fluidly couples the coolant supply conduit 106 to the coolant return conduit 108 and envelopes an end portion 38 of the A-phase feeder cable 32.

It is contemplated that the liquid coolant pump 112 be arranged along the coolant supply conduit 106 to force the liquid coolant 110 through the coolant jacket 104 for active cooling of the end portion 38 of the feed bus 24 by removal of heat Q from the end portion 38 of the feed bus 24. It is also contemplated that the heat exchanger 114 be arranged along the coolant return conduit 108 to reject the heat Q to the external environment 42 prior recirculation of the liquid coolant 110 through the cold plate 126. In certain examples the liquid coolant 110 includes a hydrofluoroether (HFE) composition or water/glycol fluids. Examples of suitable HFE compositions include Novec™ engineered fluids, available from the 3M Corporation of St Paul, Minnesota.

Figure 3:
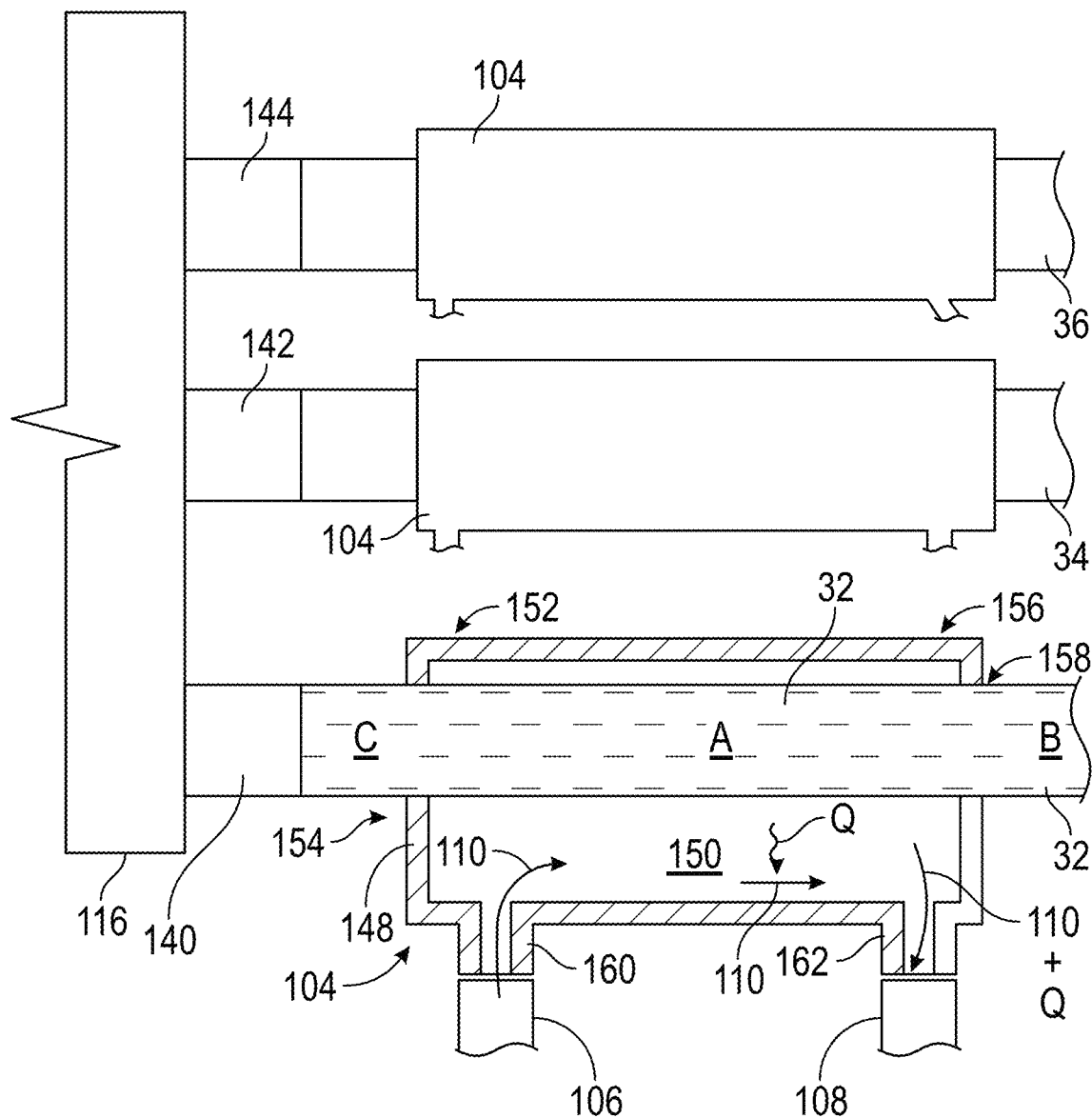
FIG. 3 is a schematic view of the portion of the motor controller electronics arrangement of FIG. 1, showing liquid coolant traversing a proximal portion of the feeder cable within the coolant jacket.

With reference to FIG. 3, the coolant jacket 104 is shown according to an example. The coolant jacket 104 includes a jacket body 148. The jacket body 148 defines therein a coolant channel 150 and has a motor controller end 152 with a motor controller feeder cable portion aperture 154, an electric motor end 156 with an electric motor feeder cable portion aperture 158, a coolant inlet port 160, and a coolant outlet port 162.

The coolant inlet port 160 extends through the jacket body 148 between the motor controller feeder cable portion aperture 154 and the electric motor feeder cable portion aperture 158, is in fluid communication with the coolant channel 150, and fluidly couples the coolant supply conduit 106 to the coolant channel 150. The coolant outlet port 162 extends through the jacket body 148 between the coolant inlet port 160 and the electric motor feeder cable portion aperture 158, is in fluid communication with the coolant channel 150, and fluidly couples the coolant return conduit 108 to the coolant channel 150. The end portion 38 of the feed bus 24 (shown in FIG. 2) is arranged within the coolant channel 150 for circulating the liquid coolant 110 along the end portion 38 of the feed bus 24 arranged within the coolant channel 150.

As the liquid coolant 110 traverses the coolant channel 150 heat Q, generated resistively within the feed bus 24 from communication therethrough of the supply power 30 (shown in FIG. 2), is communicated between the liquid coolant 110 and the feed bus 24. Transfer of the heat Q causes the end portion 38 of the feed bus 24 between the motor controller feeder cable portion aperture 154 and the motor controller 102 (shown in FIG. 2) to run at a lower temperature than an electric motor portion 50 of the feed bus 24 between the electric motor feeder cable portion aperture 158 and the electric motor 16 (shown in FIG. 1). This limits conduction of the heat Q into the motor controller 102, limiting heating of the auxiliary circuitries 122 (shown in FIG. 2), e.g., such that the temperature of the auxiliary circuitries 122 remains the temperature rating 134 of the auxiliary circuitries 122.

As shown in FIG. 3 the coolant jacket 104 extends about the A-phase feeder cable 32 and in this respect is an A-phase coolant jacket. More specifically, the A-phase feeder cable 32 extends through the motor controller feeder cable portion aperture 154 and the electric motor feeder cable portion aperture 158 such that only a portion of the A-phase feeder cable 32 is cooled. Applicant has determined that by removing heat from an intermediate portion A of the A-phase feeder cable 32 only, heat generated within an electric motor portion B of the A-phase feeder cable 32, e.g., a proximal portion, can be blocked from entering the housing 116 and a motor controller portion C of the A-phase feeder cable 32, e.g., a distal portion of the feeder cable. Consequently, the motor controller portion C of the A-phase feeder cable 32 runs at a lower temperature than a temperature than the electric motor portion B of the A-phase feeder cable 32.

It is contemplated that the temperature of the motor controller portion C of the A-phase feeder cable 32 be lower than the temperature rating 134 (shown in FIG. 2) of the auxiliary circuitries 122. In certain examples the electric motor portion B of the A-phase feeder cable 32 can run about 200 degrees Celsius (about 392 degrees Fahrenheit) and motor controller portion of the A-phase feeder cable 32 run at a temperature between 70 degrees Celsius (158 degrees Fahrenheit) and 200 degrees Celsius (392 degrees Fahrenheit), e.g., at 70 degrees Celsius (158 degrees Fahrenheit), and an intermediate portion 40 of the A-phase feeder cable 32 is arranged within an interior 164 of the coolant jacket 104.

As also shown in FIG. 3 the motor controller electronics arrangement 100 includes a B-phase coolant jacket 160 and a C-phase coolant jacket. The B-phase coolant jacket 160 is similar to the A-phase coolant jacket 104 and additionally extends about the B-phase feeder cable 34, is separated from the solid-state switch array 118 by the housing 116 and is also in liquid communication with the cold plate 126. The C-phase coolant jacket 170 is similar to the A-phase coolant jacket 104 and additionally extends about the C-phase feeder cable 36, is separated from the solid-state switch array 118 by the housing 116 and is also in liquid communication with the cold plate 126.

Figure 4:
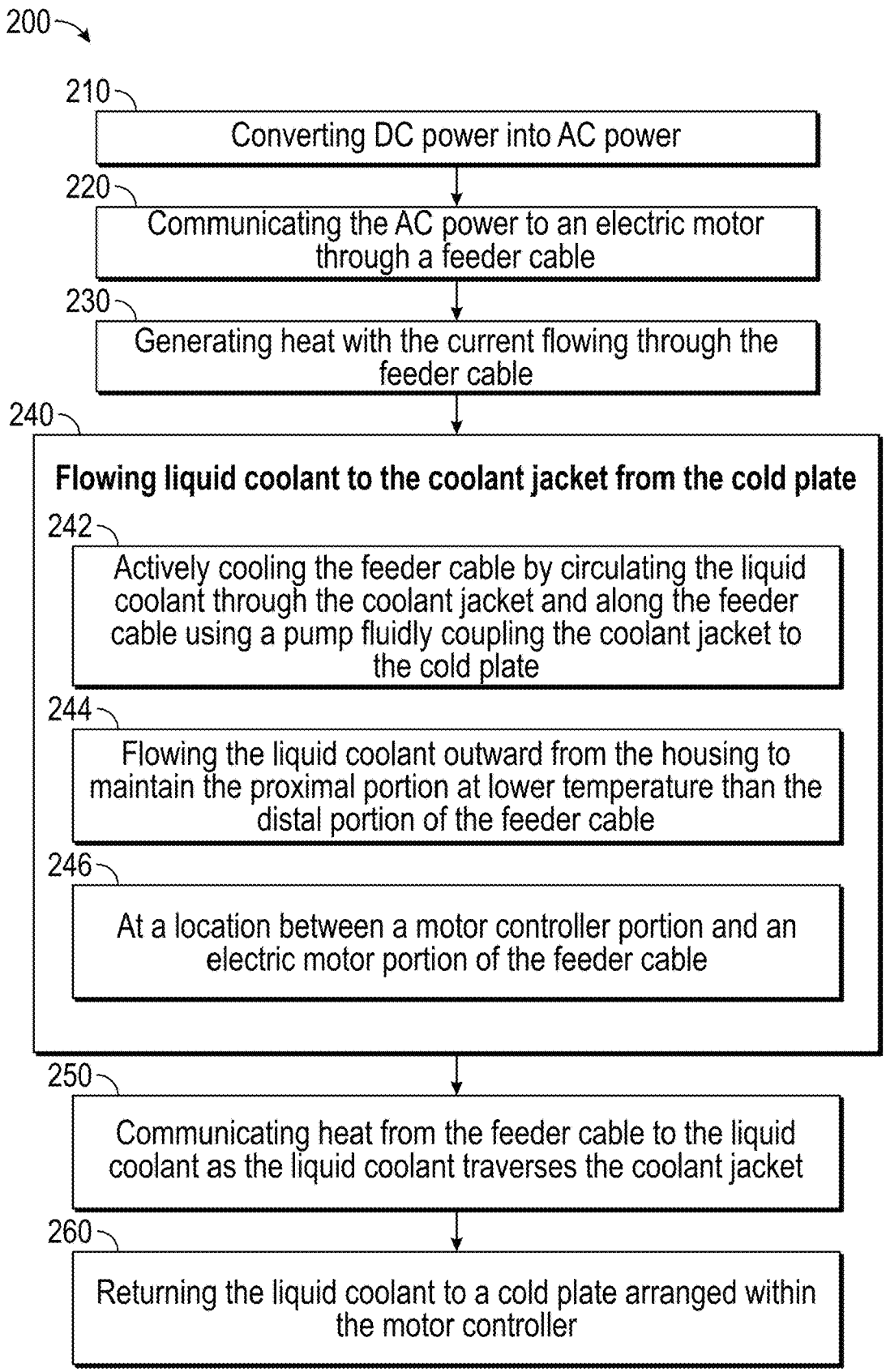
FIG. 4 is a block diagram of a method of cooling a motor controller electronics arrangement, showing operations of the method according to an illustrative and non-limiting example of the method.

With reference to FIG. 4, a method 200 of cooling a feeder cable, e.g., a feeder cable of the feed bus 24 (shown in FIG. 1), is shown. The method 200 includes converting DC power into AC power, e.g., the source power 26 (shown in FIG. 1) into the supply power 30 (shown in FIG. 1), as shown with box 210. The AC power is communicated to an electric motor through a feeder cable, e.g., to the electric motor 16 (shown in FIG. 1) through the A-phase feeder cable 32 (shown in FIG. 3), as shown with box 220. It is contemplated heat be generated with the flow of AC power through the feeder cable, e.g., the heat Q (shown in FIG. 2), as shown with box 230.

As shown with box 240, a liquid coolant is flowed through a coolant jacket from a cold plate arranged within the housing of a motor controller, e.g., the liquid coolant 110 (shown in FIG. 2) flowed through the coolant jacket 104 (shown in FIG. 2) from the cold plate 126 (shown in FIG. 2). It is contemplated that the feeder cable be actively cooled by the liquid coolant, e.g., by pumping the liquid coolant through the coolant jacket by the liquid coolant pump 112 (shown in FIG. 2), as shown with box 242. In certain examples the liquid coolant can be flow outward from the housing and along the feeder cable in a direction toward the electric motor, e.g., from the motor controller portion C (shown in FIG. 3) of the feeder cable toward an electric motor portion B (shown in FIG. 3) of the feeder cable, as shown with box 244. In accordance with certain examples the liquid coolant can be flowed along only a portion of the feeder cable, e.g., along the intermediate portion A (shown in FIG. 3) of the feeder cable, as shown with box 246.

As shown with box 250, heat Q is communicated from the feeder cable to the liquid coolant as the liquid coolant traverses the coolant jacket and along only the portion of the feeder cable. As shown with box 260, the liquid coolant is then returned to the cold plate arranged within the motor controller. It is contemplated that, in certain examples, the liquid coolant can be returned to the cold plate through a heat exchanger, e.g., the heat exchanger 114 (shown in FIG. 2), as also shown with box 260. It is also contemplated that, in accordance with certain examples, a motor controller portion of the feeder cable connected to the motor controller can be maintained below a temperature rating of auxiliary circuitries, e.g. the temperature rating 134 (shown in FIG. 2) of the auxiliary circuitries 122 (shown in FIG. 2), while an electric motor portion of the feeder cable is maintained at a temperature about the temperature rating of the auxiliary circuitries, as also shown with box 260.

Vehicles, such as aircraft, commonly employ electric motors. The electric motors are generally controlled by a motor controller to provide variable frequency AC power to the electric motor to control the speed of the motor. The variable frequency AC power is communicated to the electric motor by feeder cables, which electrically connect the motor controller to the electric motor. The variable frequency AC power generally resistively heats the feeder cable is a way that corresponds to the amount of electrical power communicated to the electric motor by the feeder cable. The heat is typically removed from the feeder cables passively with a flow of ambient air across the feeder cable, typically through cooperation of the feeder cable gauge and ambient air temperature to limit the amount of heat introduced into the motor controller by the feeder cable.

In examples described herein feeder cables are actively cooled. More specifically, the feeder cables are cooled at location outside the housing of the motor controller and proximate the housing, limiting heat communicated to the motor controller from the feeder cable. In accordance with certain examples, liquid coolant is provided to the feeder cable using coolant received from a cold plate arranged within the motor controller. It is contemplated that, in accordance with certain examples, the coolant received from the motor controller is circulated from the motor controller and through a coolant jacket surrounding a portion of the feeder cable to remove heat from the feeder cable. For example, coolant having a temperature of about 70 degrees Celsius (about 158 degrees Fahrenheit) can be introduced into the coolant jacket and communicated along a portion of the feeder cable generating heat through resistive heating otherwise sufficient to cause the cable to run at temperatures of about 200 degrees Celsius (about 392 degrees Fahrenheit). This allows the feeder cable to run relatively hot in relation to the temperature rating of auxiliary circuitries within the housing of the motor controller as the coolant jacket limits (or eliminates entirely) introduction of heat from the feeder cable into the interior of the housing of the motor controller.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronics assembly, including,
a motor controller electronics arrangement, comprising:
   a housing enclosing a solid-state switch array;
   a cold plate arranged within the housing and in thermal communication with the solid-state switch array;
   a feeder cable electrically connected to the solid-state switch array; and
   a coolant jacket extending about the feeder cable and separated from the switch arrangement by the housing,
   wherein the feeder cable is in liquid communication with the cold plate to limit communication of heat from the feeder cable to an interior of the housing.

2. The electronics assembly of claim 1, further comprising a coolant supply conduit fluidly coupling the coolant jacket to the cold plate.

3. The electronics assembly of claim 1, further comprising a coolant return conduit fluidly coupling the coolant jacket to the cold plate.

4. The electronics assembly of claim 1, further comprising a liquid coolant circulating between the coolant jacket and the cold plate.

5. The electronics assembly of claim 1, wherein the feeder cable comprises:
   an electric motor portion;
   a motor controller portion connected to the electric motor portion; and
   an intermediate portion connected the motor controller portion to the electric motor portion, wherein the electric motor portion of the feeder cable is spaced apart from the motor controller portion of the feeder cable by the intermediate portion of the feeder cable.

6. The electronics assembly of claim 1, wherein the coolant jacket is spaced apart from the housing.

7. The electronics assembly of claim 1, wherein the coolant jacket has a coolant inlet and a coolant outlet, and wherein the coolant inlet separates the coolant outlet from the housing along the feeder cable.

8. The electronics assembly of claim 7, further comprising a coolant supply conduit fluidly coupling the coolant inlet to the cold plate.

9. The electronics assembly of claim 7, further comprising a coolant return conduit fluidly coupling the coolant outlet to the cold plate.

10. The electronics assembly of claim 7, further comprising a liquid coolant traversing the coolant jacket and in thermal communication with the feeder cable through the coolant jacket.

11. The electronics assembly of claim 1, further comprising a source terminal electrically connected to the feeder cable by the switch arrangement.

12. The electronics assembly of claim 1, further comprising:
   a pump fluidly coupling the cold plate to the coolant jacket; and
   a heat exchanger fluidly coupling the coolant jacket to the cold plate.

13. The electronics assembly of claim 1, further comprising an electric motor electrically connected to the switch arrangement by the feeder cable.

14. The electronics assembly of claim 1, wherein the feeder cable is an A-phase feeder cable, wherein the coolant jacket is an A-phase coolant jacket, and further comprising:
   a B-phase feeder cable electrically connected to the solid-state switch array; and
   a B-phase coolant jacket extending about the B-phase feeder cable, wherein the B-phase coolant jacket is separated from the solid-state switch array by the housing and is in liquid communication with the cold plate.

15. An electrical system, comprising:
   an electric motor;
   the electronics assembly as recited in claim 1, wherein the feeder cable is electrically connected to the electric motor; and
   a power source electrically connected to the feeder cable by the solid-state switch array.

16. The electrical system of claim 15, wherein the electronics assembly further comprises:
- a coolant supply conduit fluidly coupling the coolant jacket to the cold plate;
- a coolant return conduit fluidly coupling the coolant jacket to the cold plate; and
- a liquid coolant circulating between the coolant jacket and the cold plate.

17. The electrical system of claim 15, wherein the coolant jacket has a coolant inlet and a coolant outlet, and wherein the coolant inlet separates the coolant outlet from the housing along the feeder cable, the motor controller electronics arrangement further comprising:
- a pump fluidly coupling the cold plate to the coolant jacket; and
- a heat exchanger fluidly coupling the coolant jacket to the cold plate.

18. A method of cooling a feeder cable, comprising:
- at a housing enclosing a solid-state switch array, a cold plate arranged within the housing and in thermal communication with the solid-state switch array, and a feeder cable electrically connected to the solid-state switch array and having a coolant jacket extending thereabout that is separated from the solid-state switch array by the housing and in liquid communication with the cold plate,
- generating heat with supply power flowing through the feeder cable;
- flowing liquid coolant to the coolant jacket from the cold plate;
- communicating heat from the feeder cable to the liquid coolant as the liquid coolant traverses the coolant jacket; and
- returning the liquid coolant to the cold plate.

19. The method of claim 18, further comprising actively circulating the liquid coolant through the coolant jacket and along the feeder cable using a pump fluidly coupling the coolant jacket to the cold plate.

20. The method of claim 18, wherein the feeder cable has a proximal portion and a distal portion, the proximal portion connecting the distal portion to the housing, the method further comprising flowing the liquid coolant outward from the housing to maintain the proximal portion at lower temperature than the distal portion of the feeder cable.

* * * * *